United States Patent [19]

Adolfsson et al.

[11] Patent Number: 4,547,729
[45] Date of Patent: Oct. 15, 1985

[54] OPTICAL FIBER MEASURING DEVICES

[75] Inventors: Morgan Adolfsson; Torgny Brogardh, both of Västerås, Sweden

[73] Assignee: Asea Aktiebolag, Västerås, Sweden

[21] Appl. No.: 380,880

[22] Filed: May 21, 1982

Related U.S. Application Data

[63] Continuation of Ser. No. 83,273, Oct. 10, 1979, abandoned.

[51] Int. Cl.[4] .................... G01R 19/00; G01R 5/28
[52] U.S. Cl. ........................... 324/96; 324/105; 324/109
[58] Field of Search ............... 324/96, 97, 109, 105; 332/7.51; 350/285; 455/600, 605, 606, 607, 609–619

[56] References Cited

U.S. PATENT DOCUMENTS 1,760,383  5/1930  Thomas ........................... 324/109

OTHER PUBLICATIONS

Sheiner et al.; "Direct Conversion . . . "; IBM Tech. Dis. Bull.; vol. 22; No. 1; Jun. 1979; pp. 208–209.

Primary Examiner—Ernest F. Karlsen
Attorney, Agent, or Firm—Watson Cole Grindle & Watson

[57] ABSTRACT

The invention is directed to an optical fiber device for measuring of current and/or voltage, including at least one light conductor for transmitting optical signals between an optical transducer and light generating and light processing circuitry, respectively. A sensed electrical measuring signal is transmitted to a transducer for conversion to a mechanical movement which modulates the light flux received by the transducer.

10 Claims, 13 Drawing Figures

OPTICAL FIBER MEASURING DEVICES

This is a continuation of application Ser. No. 83,273 filed Oct. 10, 1979 now abandoned.

BACKGROUND

1. Field of the Invention

This invention relates to optical fiber devices for measuring current or voltage, and more particularly at least to such devices wherein one light conductor is used to transmit optical signals between a measuring transducer and light generators and processing circuitry, respectively.

2. Prior Art

When measuring current or voltage, electromechanical, electronic instruments, or a combination of the two are normally used, which elements are electrically connected to transformers, shunts or voltage dividers. One of the major problems of such measuring systems is to eliminate the influence of disturbances, i.e. to suppress disturbances that may enter into the transmission of signals, or to suppress cophasal disturbing voltages ("common-mode"-suppression). Other problems are associated with measurement at high potentials, to guard against electrical spark-overs and to make measuring systems with inherent self-securing features.

SUMMARY OF THE INVENTION

The invention solves such problems and others in connection therewith. The invention is characterized in that a sensed electrical measuring signal is transferred to a transducer for conversion to a mechanical movement, whereby that movement modulates light flux received by the transducer. Such measuring devices are reliable and inexpensive. It is possible to obtain measurements of very great exactness and which are independent of instabilities and ageing phenomena in the light conductors, photo- and light-emitting diodes, for example. The sensing device and the transducer can be made in very small dimensions, and the device can, among other things, be used for debiting and relay protection purposes.

BRIEF DESCRIPTION OF THE FIGURES

The invention is exemplified more in detail in the attached Figures, of which:

FIG. 6 shows a modification of the embodiment of FIG. 5a;

DETAILED DESCRIPTION

Figure 1:
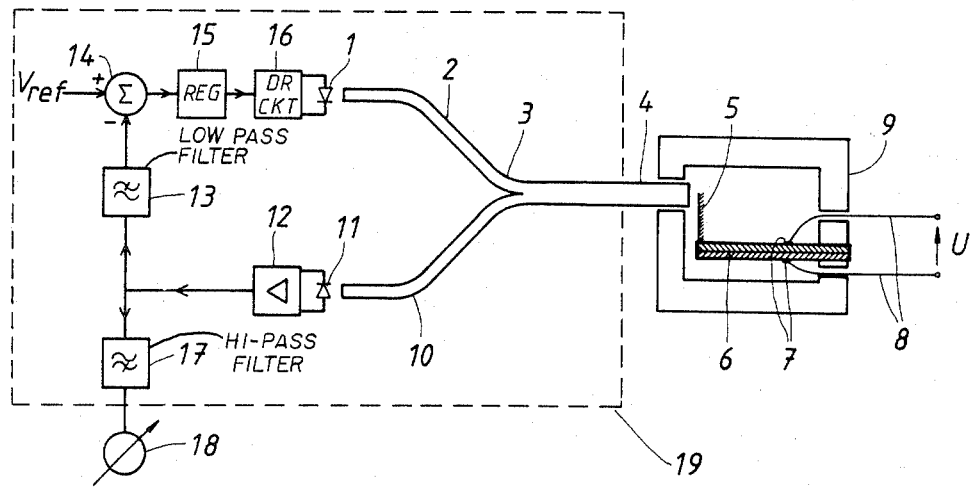
FIG. 1 shows a fiber optical AC voltage measuring device with a piezo-electrical bimorphic modulator.

In FIG. 1 an optical fiber device for measuring current or voltage is shown, where the measuring voltage U influences a bimorphic piezo-electric, optical modulator 6. Light is emitted from the source of light, light emitting diode 1, through light conducting fiber 2, fiber branch 3 and common fiber 4 into transducer 9. Common fiber 4 is terminated right in front of mirror 5, which reflects a part of the emitted light from fiber 4 back into fiber 4, and from there a part of the light is transmitted through branch 3 back to fiber 10 and from there to photodiode 11.

Measuring voltage U is transferred by the incoming lines to transducer 9 at two contact points 7, connected to the electrodes of the bimorphic, alternatively multimorphic, piezo-electrical element 6, which on account of the piezo-electrical power will be bent by the superposed electrical field. This bending of element 6 is transferred to mirror 5 placed at the external part thereof, and the bending will be detected by fiber 6. Mirror 5 then moves upwardly or downwardly according to the value of measuring voltage U.

In order to stabilize the fiber optics and the opto-electronics, the low frequency components of the photocurrent amplified in amplifier 12, received by photodiode 11, are used. This current regulates the light emitting diode current of light emitting diode 1 by low-pass filter 13, differential circuit 14, regulator 15 and drive circuit 16. The measuring signal is obtained from amplifier 12 through high-pass filter 17 and can be read at measuring instrument 18. As an example of stabilization, assume that fiber 4 bends differently, that the photodiode and the light emitting diode age, and temperature drifts might occur, but such variations are compensated in the way shown by the feedback through amplifier 12 and low-pass filter 13.

Figure 2:
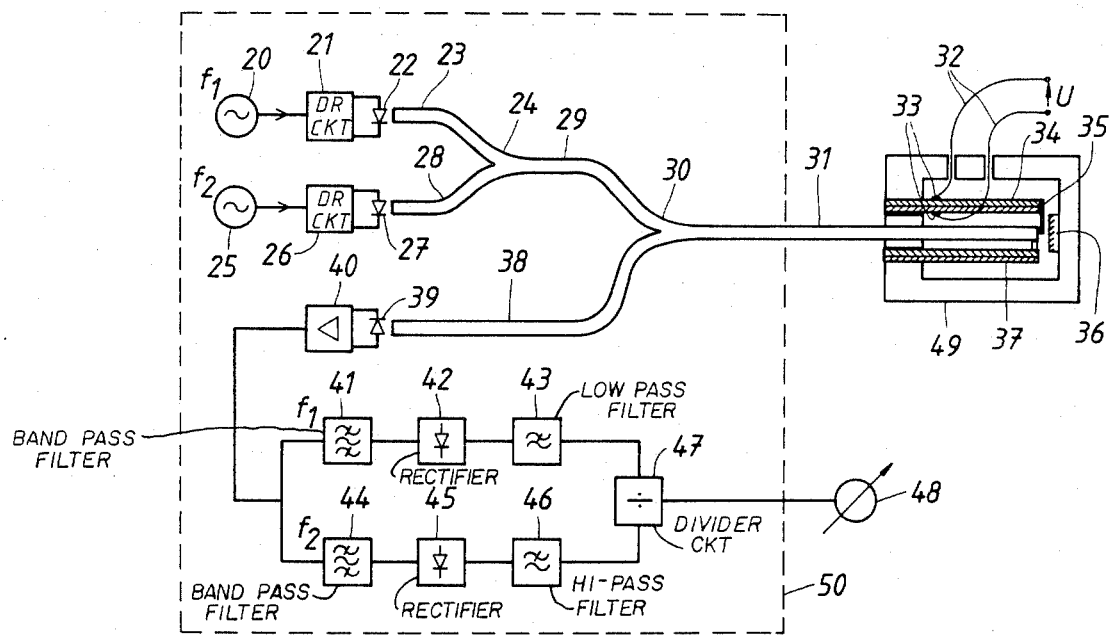
FIG. 2 shows a temperature compensated bimorphic modulator, where light from two different wavelengths is used.

In FIG. 2 an arrangement is shown of an optical fiber voltage measuring device, where measuring voltage U is transferred to transducer 49 and thereby influences piezo-electrical element 34 at electrodes 33. Oscillator 20 modulates, through driver circuit 21, the light from light emitting diode 22 at frequency $f_1$. Second oscillator 25 modulates, through driver circuit 26, the light from second light emitting diode 27 at frequency $f_2$, separated from frequency $f_1$. Light emitting diodes 22 and 27 emit light at different wavelengths ($\lambda_1$ respectively $\lambda_2$), which is conducted by light conducting fiber 23, 28, respectively, and transmitted by fiber branch 24 to joint light conducting fiber 29, and, in turn, is further transmitted to fiber branch 30 and light conducting fiber 31, and is finally reflected upon mirror 36 in transducer 49. Between the end of fiber 31 and mirror 36 is a shield 35 arranged in the form of an optical filter. This filter allows signals within a certain range of wavelengths to pass through but blocks the signals within another range of wavelengths.

Filter 35 is fixed to a bimorphic, alternatively multimorphic, piezo-electric element 34, to which measuring voltage U is connected by lines 32 at contact points 33. The piezo-electric effect produced by the impressed electrical field causes a protuberance of element 34, and thereby a displacement of shield 35 in front of the fiber end. To reduce the temperature influence, optical fiber 31 is fixed to piezo-electric element 37 of the same material as piezo-electric element 34, i.e. the element to which voltage U was transferred. The interference filter has the property of allowing the light wavelength $\lambda_1$ to pass through but not the wavelength $\lambda_2$. The light which is reflected from mirror 36 is re-transmitted back through fiber 31, and a part of the same passes via fiber branch 30 to fiber 38. The optical signals are transformed to electrical form by photodiode 39 and photocurrent amplifier 40. The components of frequencies $f_1$ and $f_2$ are separated and demodulated through band pass filters 41, 44, respectively, ($f_1$, $f_2$), rectifiers 42, 45, respectively, and low-pass filters 43, 46, respectively. The outgoing signal from low-pass filter 43 is not influenced by the position of shield 35, as it is positioned in such a way that it allows wavelength $\lambda_1$ to pass through and the outgoing signal is consequently independent of the measuring signal. The outgoing signal from low-pass filter 46 is dependent on the position of shield 35 and is modulated in accordance with measuring signal U. The quotient formed in division circuit 47 permits the output signal to be compensated for the variations of the parameters in the transmission. The measuring device can be used for d.c. voltage as well as for a.c. voltage, and the only condition is that frequencies $f_1$ and $f_2$ have to be chosen higher than all measuring frequencies of interest. By the division of the optical signals in different frequencies and by the quotient formed, compensation is obtained for errors that otherwise would be found in an optical fiber measuring device.

Figure 3:
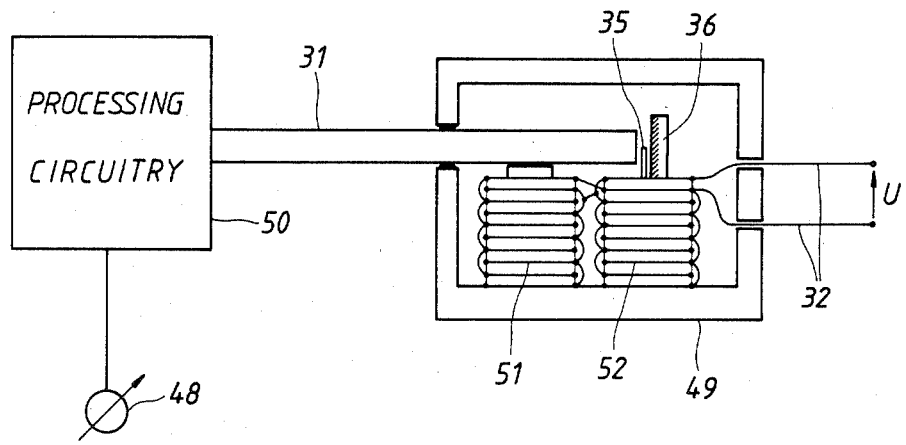
FIG. 3 shows an optical fiber measuring device with two piezo-electrical piles.

The arrangement according to FIG. 3 is an optical fiber voltage measuring device, where measuring voltage U is connected by lines 32 to two piles of piezo-electric elements 51, 52 connected in parallel. Measuring voltage U is connected with different polarities to each of the piles, such that a positive voltage increases the height of one of the piles and reduces the height of the other one, and vice versa. The use of two piles reduces the temperature influence while at the same time doubles the sensitivity. At one of the piles 51 fiber end 31 is fixed and at the other pile 52 there is mirror 36 in a fixed arrangement with a shield in the form of optical filter 35, which covers a part of the fiber end. Measuring voltage U moves shield 35 relative to the fiber and modulates the light in fiber 31. Processing circuitry 50 and indicating instrument 48 are the same as the arrangement according to FIG. 2.

Figure 4:
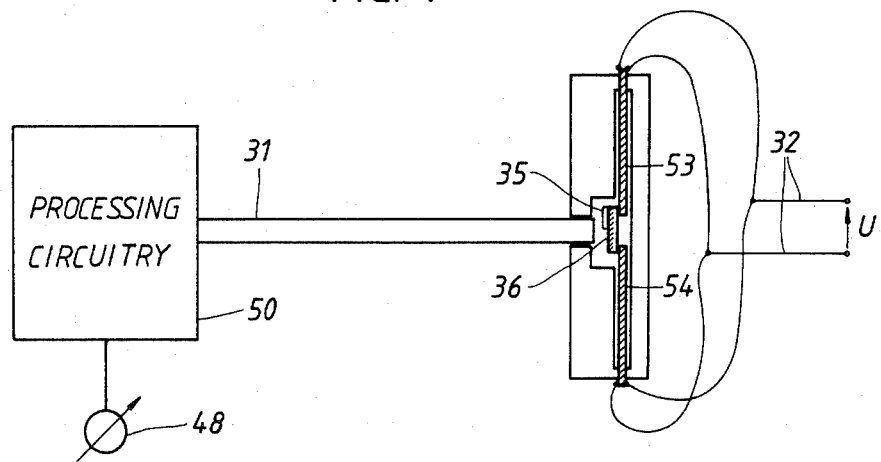
FIG. 4 shows a similar optical fiber measuring device with piezo-electrical polymers.

In the modified optical fiber voltage measuring device of FIG. 4, electro-optical transformation is brought about with a piezo-electric high-polymer material. Measuring voltage U is connected by measuring lines 32 with different polarities to two film pieces of piezo-electric high-polymer elements 53 and 54. The inversion of the polarity stretches one of the films, while the other one contracts when a voltage is connected at the input. Polymer films 53 and 54 are connected to mirror 36, on the surface of which there is a shield in the form of optical filter 35. The respective expansion and contraction of the films causes mirror 36 and shield 35 to move. The light in fiber 31 is modulated by the movements of shield 35 and thereby reproduces input signal U. Processing circuitry 50 and indicating instrument 48 are the same as at the arrangement according to FIG. 2.

Figure 5A:
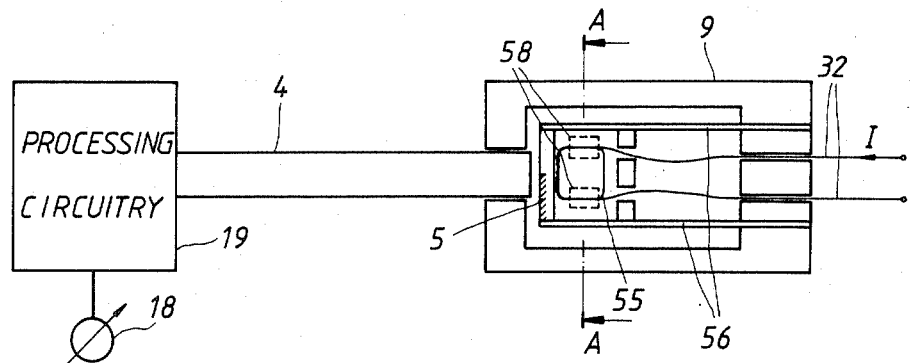
FIG. 5a shows transducer modulation by magnetic forces acting between a coil with circulating current and a magnetic field from a permanent magnet.
Figure 5B:
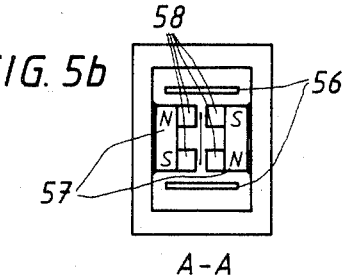
FIG. 5b shows the arrangement of the permanent magnet and coils.

In the optical fiber current measuring device shown in FIG. 5a, the light is modulated with the aid of a coil in a magnetic field. Here the measuring signal is current I, which circulates in coil 55, which together with mirror 5 is suspended by springs 56, arranged in transducer envelope 9. Coil 55 is situated in a static magnetic field, produced by two permanent magnets 57, as shown in FIG. 5b. The magnetic field is concentrated by the coils of soft iron pieces 58. Through interaction between the static magnetic field and the field, which is produced by measuring current I in coil 55, the coil is exposed to a force, which produces a bending out of double springs 56. The bending causes a parallel displacement of half-mirror 5 over the end of fiber 4, and thereby a modulation of the light is obtained. Processing circuitry 19 and indicating instrument 18 are the same as shown in FIG. 1. Mirror 5 moves up and down in transducer 9 with high accuracy.

Figure 6:
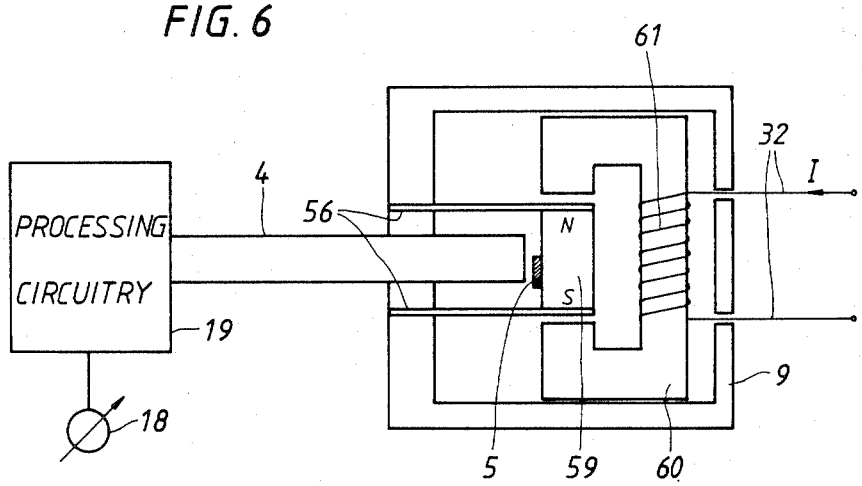

An embodiment of an optical fiber current measuring device is shown in FIG. 6, where measuring current I is conducted through coil 61, placed within yoke 60 of ferromagnetic material. In the opening of yoke 60 is permanent magnet 59, which is suspended by springs 56 fixed to transducer envelope 9. Permanent magnet 59 is also provided with mirror 5, the surface of which partly covers the end of fiber 4, which has been drawn in through transducer envelope 9. The light is modulated by the current through coil 61 generating a magnetic flux through yoke 60, and a magnetic field is obtained in the opening of the yoke. Permanent magnet 59 is thereby exposed to a force, bending out springs 56 and displacing the border of mirror 5. The movement of mirror 5 modulates the light flux in fiber 12. Processing circuit 19 and indicator 18 are the same as shown by the arrangement according to FIG. 1.

Figure 7:
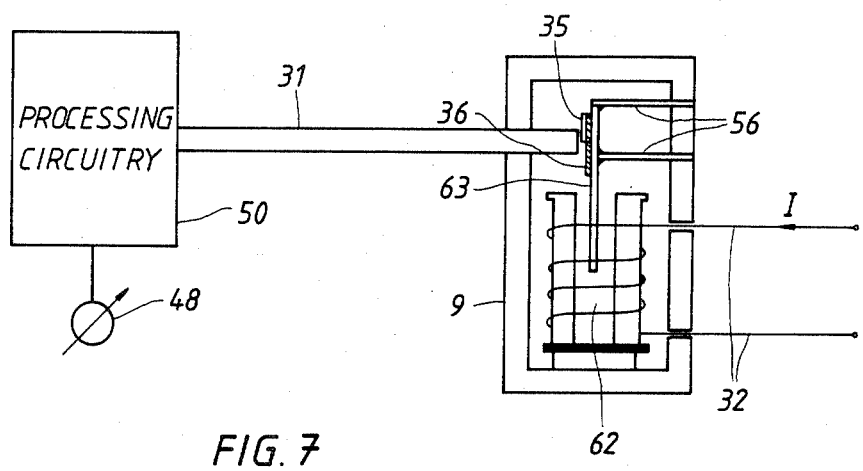
FIG. 7 shows a transducer with a magnetic force acting between a coil with circulating current and a piece of soft iron.

In the embodiment of FIG. 7, an optical fiber current measuring device is shown, where measuring current I gives rise to a magnetic field, which influences magnetic material 63. Measuring current I circulates in coil 62, and at the inside of which there is a portion of magnetic material 63, e.g. soft iron, suspended by springs 56 and provided with mirror 36. Between mirror 36 and the end surface of fiber 31 a shield in the form of optical filter 35 is placed. Measuring current I in coil 62 attracts magnetic material 63 and bends out springs 56, and thereby causes a displacement of shield 35 over the end surface of fiber 31, whereby the light is modulated. Processing circuitry 50 and indicator 48 are the same as shown in FIG. 2.

Figure 8:
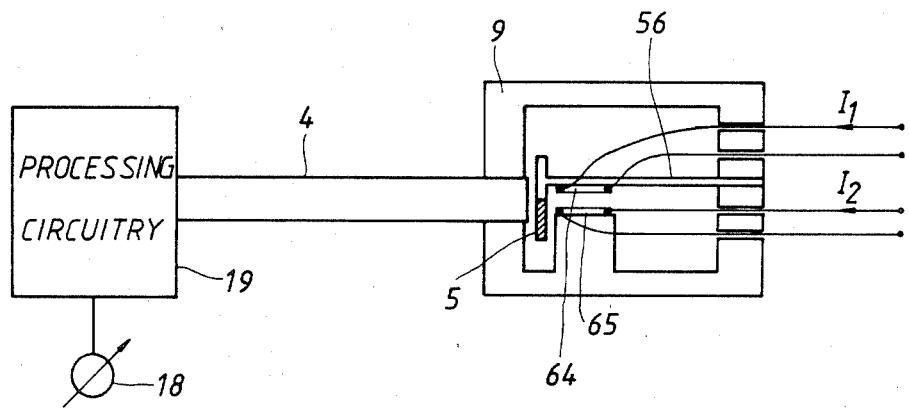
FIG. 8 shows a modified embodiment thereof using two coils with circulating current.

In the embodiment of FIG. 8 an arrangement with an optical fiber current measuring device is shown, which uses the force developed between two coils with circulating current. Measuring current $I_1$ circulates in coil 64, mounted on spring 56, and measuring current $I_2$ passes through fixed coil 65. Currents $I_1$ and $I_2$ develop a force between the coils, and thereby a bending out of spring 56, fixed to transducer envelope 9. On spring 56 there is mirror 5 partly covering the end of fiber 4. The bending out of spring 56 causes a displacement of the border of mirror 5 and by means thereof a modulation of the light in fiber 4. Processing circuitry 19 and indicator 18 are the same as shown in FIG. 1. The output signal is proportional to the product of the currents $I_1$ and $I_2$, whereby the measuring device also can be used for the measuring of power with the addition of only one coupling resistance.

Figure 9:
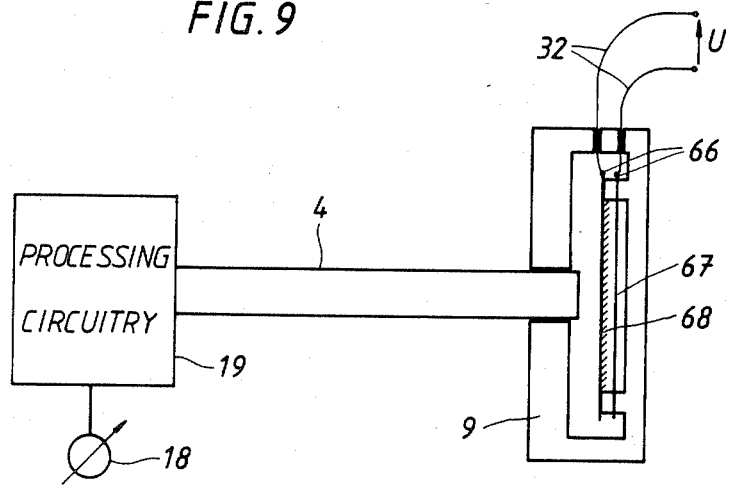
FIG. 9 shows a transducer with electrostatic energy acting between metal membranes.

The arrangement in FIG. 9 is an optical fiber voltage measuring device with an optical modulator actuated by a force developed between capacitor plates. Measuring voltage U is connected by measuring lines 32 and connection points 66 to two capacitor plates 67 and 68. Capacitor plate 67 is fixed and rigid, and capacitor 68 consists of an elastic membrane, the deformity of which depends upon the voltage impressed. Capacitor 68 has a light reflecting surface, and the light in fiber 4 is modulated by the movements of the membrane of the capacitor and consequently dependent on input signal U. Processing circuitry 19 and indicator 18 are the same as shown in FIG. 1. The electrometer transducer of FIG. 9 is characterized by a very high input impedance.

Figure 10:
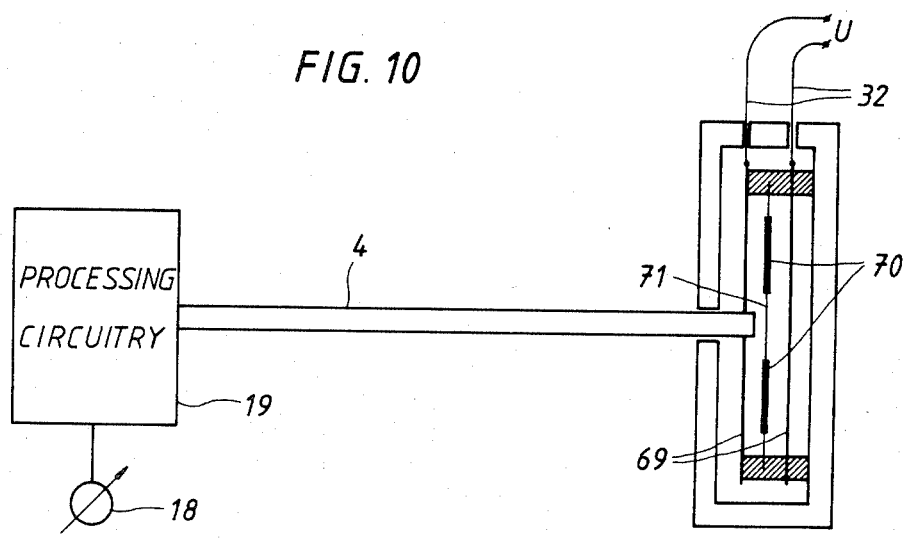
FIG. 10 is a modified embodiment using ferromagnetic material.

In FIG. 10 a voltage measuring device with an optical modulator is shown, which is based on a force developd on a ferroelectric material in an electrical field. Measuring voltage U is impressed on rigid conducting plates 69, and between the plates membrane 71 with a cover of ferroelectric material 70 is placed. The measuring voltage creates an electrical field between plates 69 which influences ferroelectrical material 70 and deforms membrane 71. Membrane 71 reflects light, such that the movement of the membrane modulates the light in fiber 4. Processing circuitry 19 and indicator 18 are the same as shown in FIG. 1.

Figure 11:
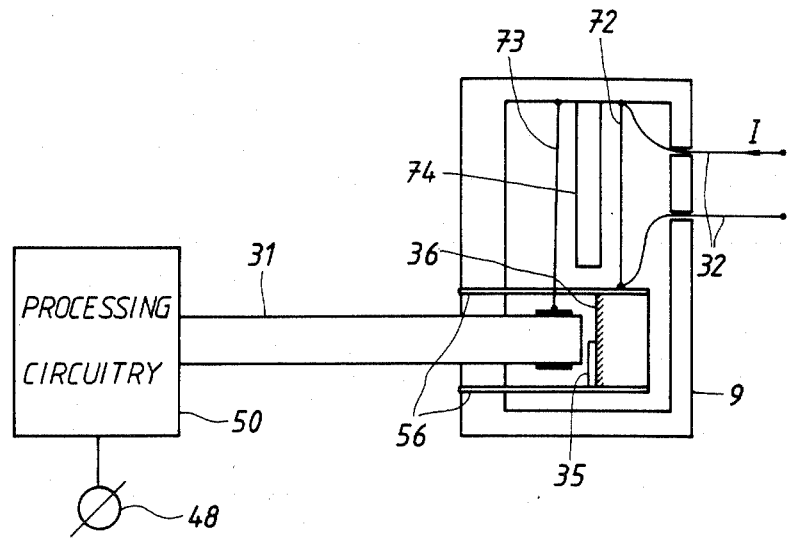
FIG. 11 shows a modulating device with a linear expansion body.

The arrangement in FIG. 11 is a current measuring device with an optical modulator, based on the fact that a stretched wire with circulating current heats and expands. Measuring current I is conducted by wire 72, the end point of which is fixed to the upper support of envelope 9. The other end of wire 72 is stretched with double springs 56 and fixed to mirror 36 with optical filter 35 in front of it. Optical filter 35 partially covers the end of fiber 31, which is suspended by wire 73 of the same material as wire 72, and thereby ambient temperature variations are compensated. The measuring current through wire 72 causes a lengthening thereof and a displacement of mirror 36 and filter 35. A modulation of the incoming light in fiber 31 is thereby obtained, which is reflected to processing circuitry 50, which along with indicator 48 is the same as shown in FIG. 2.

Figure 12:
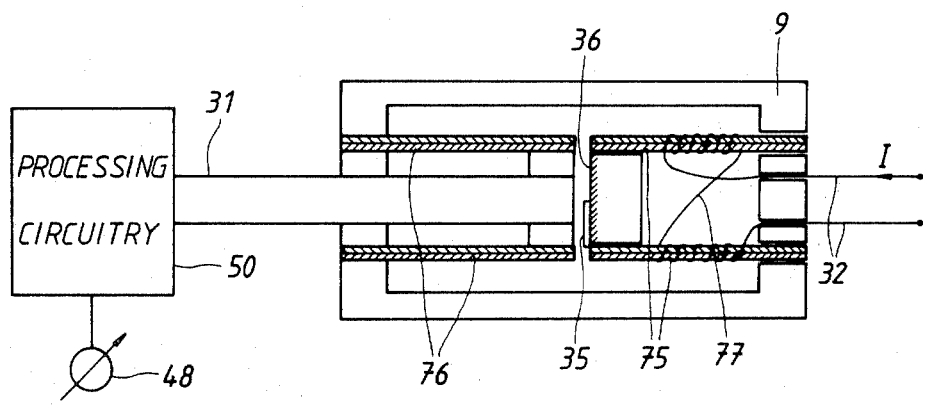
FIG. 12 shows a modification thereof using two bimetal organs.

The arrangement in FIG. 12 is an optical fiber current measuring device with an optical modulator based on the fact that current through a wire heats and bends bimetals. Measuring current I is conducted through wire 77 wound around two bimetallic springs 75. Bimetallic springs 75 are firmly stretched at one end and fixed to mirror 36 at the other end. Part of the mirror surface is covered by interference filter 35, which also partly covers the end surface of fiber 31. Measuring current I circulating through wire 77 heats and thereby expands bimetallic springs 75, and thereby interference filter 35 moves over the end surface of fiber 31 and modulates the light. To compensate for ambient temperature variations fiber end 31 is supported between two bimetallic elements 76 of the same type as bimetallic elements 75. Processing circuitry 50 and indicator 48 are the same as shown in FIG. 2.

We claim:

1. Fiber optical device for measuring electrical signals comprising:
a transducer for receiving the electrical signals and including at least one deformable element for generating mechanical movement in response to said electrical signals and having means for filtering light mounted thereon;
means for generating light having at least two different wavelengths;
a fiber optic light conductor for transmitting light to said transducer from said means for generating light;
means for reflecting light immovably mounted adjacent the transmission end of said fiber optic light conductor within said transducer;
said means for filtering being positioned between said fiber optic light conductor transmission end and said means for reflecting light to filter only one of the wavelengths of light generated by said means for generating light and moved in accordance with the deformation of said at least one deformable element;
said fiber optic light conductor transmitting the two different wavelengths of light generated by said means for generating light to said means for reflecting light and said means for filtering;
the mechanical movement of said means for filtering continuously modulating at least portions of the light to generate a measuring component light signal dependent upon said mechanical movement, and the light not intercepted by said means for filtering being reflected by said means for reflecting and being independent of said mechanical movement, whereby said measuring component light signal and said reflected light have different detectable characteristics;
said fiber optic light conductor transmitting said light measuring signal and said reflected light from said transducer; and
means for separating said measuring component light signal and said reflected light from one another.

2. A transducer as in claim 1 wherein said reflecting means is a mirror.

3. The fiber optical device of claim 3 wherein there are two of said at least one deformable elements, said light conductor being mounted to one of said deformable elements and said means for filtering light being mounted to the other of said deformable elements, said electrical signals being input to each of said deformable elements in opposite polarity to one another whereby the sensitivity of the transducer is doubled.

4. Fiber optical device as in claim 1, wherein said deformable element is formed of piezo-electric material.

5. An optical fiber device for measuring electrical parameters, comprising the fiber optical device as claimed in claim 1 and wherein said means for generating light includes a light source for emitting light through said light conductor, means for generating an electrical signal in response to the light reflected through said light conductor from said means for reflecting light, means responsive to said electrical signal for stabilizing the light from said means for generating light in accordance with a reference signal, and means for filtering said electrical signal to provide an indication of the measured electrical parameter.

6. An optical fiber device for measuring electrical parameters, comprising the fiber optical device of claim 1 and wherein said means for generating light includes first and second light sources for generating respective first and second light of said different wavelengths for transmission through said light conductor to said means for reflecting, said first and second light wavelengths being reflected from said means for reflecting light with and without modulation, respectively, and further comprising means for generating electrical signals from said measuring component light signal and said reflected light transmitted through said light conductor from said transducer, means for extracting an electrical measuring signal and an electrical stabilizing signal from said electrical signals, and means for generating a stabilized measuring signal from said electrical signals representative of the measured electrical parameter independent of instabilities in said measuring device.

7. An optical fiber device for measuring electrical parameters comprising the fiber optical device of any one of claims 3 or 4 and wherein said means for generating light includes first and second light sources for generating respective first and second light of said at least two different wavelengths for transmission through said light conductor to said transducer, said first and second light wavelengths being reflected from said means for reflecting light with and without modulation, respectively, said means for separating including means for generating electrical signals from said measuring component light signal and said reflected light transmitted through said light conductor from said transducer, means for extracting a measuring signal and a stabilizing signal from said electrical signals, and means for generating a stabilized measuring signal from said electrical signals representative of the electrical parameter independent of instabilities in said measuring device.

8. Fiber optical device as in claim 1 wherein said light measuring signal and said reflected light have different wavelengths.

9. Fiber optical device as in claim 1, wherein said light measuring signal and said reflected light have different modulating frequencies.

10. Fiber optical device for measuring electrical signals as claimed in claim 1 further comprising electronic means including electronic filter means responsive to said light measuring signal and said reflected light for producing measuring signals and stabilizing signals, said measuring signals being independent of instabilities in said electronic means, said transducer and said fiber optic light conductor.

* * * * *